(12) United States Patent
Yamauchi

(10) Patent No.: US 6,796,481 B2
(45) Date of Patent: *Sep. 28, 2004

(54) CHIP MOUNTING METHOD

(75) Inventor: Akira Yamauchi, Shiga (JP)

(73) Assignee: Toray Engineering Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/169,982

(22) PCT Filed: Dec. 27, 2000

(86) PCT No.: PCT/JP00/09306

§ 371 (c)(1),
(2), (4) Date: Jul. 12, 2002

(87) PCT Pub. No.: WO01/52316

PCT Pub. Date: Jul. 19, 2001

(65) Prior Publication Data

US 2003/0000998 A1 Jan. 2, 2003

(30) Foreign Application Priority Data

Jan. 14, 2000 (JP) ........................................ 2000-006559

(51) Int. Cl.[7] .......................... B23K 31/02; H05K 3/30; H01L 21/44
(52) U.S. Cl. ............................. 228/180.1; 228/180.21; 228/180.22; 29/832; 438/612
(58) Field of Search ...................... 228/180.1, 180.21, 228/180.22; 29/830, 832, 840, 841; 438/108, 127, 612

(56) References Cited

U.S. PATENT DOCUMENTS

| | | | | | |
|---|---|---|---|---|---|
| 6,132,646 | A | * | 10/2000 | Zhou et al. | 252/512 |
| 6,373,142 | B1 | * | 4/2002 | Hoang | 257/783 |
| 6,399,426 | B1 | * | 6/2002 | Capote et al. | 438/127 |
| 6,410,415 | B1 | * | 6/2002 | Estes et al. | 438/612 |
| 6,471,115 | B1 | * | 10/2002 | Ijuin et al. | 228/180.22 |
| 2003/0009876 | A1 | * | 1/2003 | Yamauchi | 29/832 |
| 2003/0022534 | A1 | * | 1/2003 | Terada et al. | 439/71 |
| 2003/0218261 | A1 | * | 11/2003 | Capote et al. | 257/787 |

FOREIGN PATENT DOCUMENTS

| JP | 6-89914 | A | | 3/1994 |
|---|---|---|---|---|
| JP | 06-089914 | A | * | 3/1994 |
| JP | 09-260435 | A | * | 10/1997 |
| JP | 09-260534 | A | * | 10/1997 |
| JP | 9-306951 | A | | 11/1997 |
| JP | 09-306951 | A | * | 11/1997 |

* cited by examiner

*Primary Examiner*—L. Edmondson
(74) *Attorney, Agent, or Firm*—Smith Patent Office

(57) ABSTRACT

A method for mounting a chip on a substrate includes applying the underfill agent onto at least one of the substrate and the chip and moving the chip to the substrate to bring the bump into contact with the electrode. The method also includes steps to distribute the underfill agent in a space between the chip and the substrate, to around the bump and the electrode, heating the bump or electrode in the state that the bump is buried in the underfill agent to melt the bump or electrode so as to weld the bump to the electrode.

10 Claims, 1 Drawing Sheet

CHIP MOUNTING METHOD

TECHNICAL FIELD OF THE INVENTION

The present invention relates to a method for mounting a chip, and specifically to a chip mounting method for mounting a chip directly onto a substrate in a form of face down and performing underfill between the chip and the substrate.

BACKGROUND ART OF THE INVENTION

A chip mounting method is well known, wherein a bump is formed on a chip by a solder and the like, the chip is approached to a substrate in a form of face down, and after the bump is brought into contact with an electrode of the substrate, the bump of the chip is heated and molten to be bonded to the electrode of the substrate. An underfill agent, which is composed of a nonconductive adhesive, is injected into a gap between the chip and the substrate in order to increase the total bonding strength between the chip and the substrate. Further, the reliability of the electrical insulation between the bonded portions is increased by a condition where the underfill agent is filled around the bump of the chip and the electrode of the substrate bonded to each other.

In a conventional chip mounting method for forming a solder bump, firstly a flux is applied to the bump or a substrate side, and after the chip is mounted on the substrate at a predetermined position, the solder bump is molten by heating (in most cases, associated with pressing) and the bump is preliminarily bonded to the electrode of the substrate. After being cooled, the flux is removed by cleaning, and thereafter, an underfill agent is injected into a minute gap between the chip and the substrate from the side direction. After the underfill agent is injected, heating is performed again, the underfill agent is re-flown and thereafter cured.

In such a conventional chip mounting method, however, when the solder bump is heated and molten in the preliminary bonding process of the chip and the substrate, there is a fear that the bonded portion is secondarily oxidized by the surrounding atmosphere. If such a secondary oxidation occurs, it may decrease the reliability of the electrical bonding between the bump and the electrode of the substrate. In order to prevent the secondary oxidation, there is a method for purging the atmosphere around the bump using nitrogen gas and the like when the bump is bonded with the electrode. However, such purging by nitrogen gas and the like causes a chip mounting apparatus to become large-sized, the mounting apparatus and the mounting process to become complicated, and the cost thereof to increase, and because it is necessary to take a time for the purging by nitrogen gas and the like, a high-speed mounting may be obstructed.

Further, in the above-described conventional mounting method, because it is necessary to apply a flux and remove the flux by cleaning after the bonding for melt-bonding of the solder bump, there is a problem that the number of processes until completion of main bonding is fairly large. Moreover, the perfect cleaning of the flux is difficult, and therefore, the residual components may reduce the reliability of the bonding. In order to achieve a fluxless bonding, proposed is a method for using an alcoholic organic material having a melting point higher than that of a solder instead of a conventional flux, and removing it by vaporizing without cleaning it after the preliminary bonding (JP-A-8-293665). However, in this method, basically only the cleaning process of the flux becomes unnecessary, and the method is poor in effect for reducing the number of the processes in the bonding. In particular, the processes for injecting an underfill agent after the preliminary bonding, for re-flowing the underfill agent and for curing the underfill agent still remain as they are. Further, in this method, as the bump pitch has been in a fine pitch condition, it has become difficult to inject the underfill agent.

DISCLOSURE OF THE INVENTION

Accordingly, an object of the present invention is to provide a chip mounting method which can prevent the secondary oxidation of a bump to be heated and molten without performing the purging by nitrogen gas and the like, and which enables to reach a main bonding process at a time with a fluxless condition, thereby simplifying both the mounting apparatus and process greatly.

To accomplish the above object, a method according to the present invention for mounting a chip by bonding a bump formed on at least one of the chip and a substrate to an electrode formed on the other and providing an underfill agent between the chip and the substrate, comprises the steps of applying the underfill agent onto at least one of the substrate and the chip, moving the chip to the substrate to bring the bump into contact with the electrode and to expand the underfill agent, in a space between the chip and the substrate, to around the bump and the electrode in contact with each other, and heating the bump or electrode in a state that the bump is buried in the underfill agent to melt the bump or electrode so as to weld the bump to the electrode. Although the material of the bump or the electrode is not particularly restricted, the present invention is suitable for mounting especially in a case where it is formed from a solder.

In the present invention, the bump is formed on at least one of the chip and the substrate. Namely, there are (A) a case where the bump is formed on the chip and the electrode is formed on the substrate, (B) a case where the bump is formed on the substrate and the electrode is formed on the chip, and (C) a case where the bump is formed on each of the chip and the substrate. Therefore, in the case of (C), the "electrode" according to the present invention means a technical concept including a bump.

In the chip mounting method according to the present invention, it is preferred that the underfill agent is expanded up to a side portion of the chip by further pushing the chip toward the substrate together with heating the bump or electrode or after the heating. Particularly, it is preferred that a fillet is formed at the side portion of the chip by the underfill agent expanded up to the side portion of the chip. By such an underfill agent expanded sufficiently broad, the bonding strength between the chip and the substrate can be increased as well as a desired excellent electrical insulation can be ensured.

Further, it is preferred that, before the chip is mounted to the substrate, at least one of the bump and electrode is treated for preventing a primary oxidation thereof, that may be generated on at least one of the bump and electrode by the time of the mounting by the atmosphere during storage and the like, or that may be generated associated with a certain pre-treatment such as heating treatment for forming a solder bump and the like. As the primary oxidation preventing treatment, for example, a treatment can be employed, wherein the bump or the electrode is cleaned by energy wave or energy particles. As the energy wave or energy particles, for example, any of plasma, ion beam, atomic beam, radical beam and laser can be used. Further, as the primary oxidation preventing treatment, for example, treatments can also be employed, wherein a substituent for removing oxygen such as a fluoro group is chemically bonded to the surface of the bump or electrode, thereby forming a anti-oxidation surface layer, wherein an oxide is removed from the surface by reducing operation due to hydrogen, and wherein gold is plated to the surface.

In the above-described chip mounting method according to the present invention, the underfill agent is applied before chip mounting, and before heating, the applied underfill agent is expanded so as to bury therein the bump and the electrode of the substrate in contact with each other, and therefore, when the bump is heated and molten, the bump is cut off from the surrounding atmosphere by the underfill agent, and the secondary oxidation of the bump can be prevented. Therefore, the purging due to nitrogen gas and the like for preventing the secondary oxidation such as a conventional method becomes unnecessary, and the apparatus and the process can be greatly simplified.

Further, if the aforementioned primary oxidation preventing treatment is carried out, the application of flux becomes unnecessary, and a further simplification becomes possible. Because the cleaning of flux after bump bonding also becomes unnecessary by making the application of the flux unnecessary, the process can be simplified also from this point of view.

This chip mounting method according to the present invention is not a method for injecting an underfill agent into a gap between a chip and a substrate after preliminarily bonding a bump and an electrode and thereafter mainly bonding them by heating as in a conventional method, but a method for expanding an underfill agent to around a bump of chip and an electrode of a substrate in contact with each other, and performing a main bonding at a time without performing a preliminary bonding by heating the bump or the electrode in the expanded underfill agent. Because this bonding is carried out through heating and melting of the bump or the electrode in the underfill agent which does not come into contact with oxygen, as mentioned above, there is no fear that the secondary oxidation occurs by heating. Besides, during this heating and melting, re-flow necessary for the bump or the electrode is carried out at the same time. Therefore, in the method according to the present invention, the mounting is completed substantially by two processes of the primary oxidation preventing treatment process and the heating and bonding process of the chip and the substrate including the application of the underfill agent, thereby greatly reducing the number of the processes for chip mounting and greatly simplifying both the process and the apparatus.

Furthermore, if the underfill agent is expanded up to the side portion of the chip by further pushing the chip toward the substrate after the bump or the electrode is softened or molten by heating, the bonding strength and the retaining strength of the chip relative to the substrate can be increased. Especially, if the underfill agent is expanded so as that a fillet can be formed on the side portion of the chip, by forming the fillet, invasion of moisture and the like into a portion between the chip and the substrate can be prevented by the underfill agent forming the fillet in addition to the underfill agent present between the chip and the substrate, and at the same time, it becomes possible to increase the retaining strength and the bonding strength of the chip. Further, because a fear that the underfill agent remains between the bump and the electrode can be removed by the above-described pushing, a more stable electric connection can be achieved therebetween.

Thus, in the chip mounting method according to the present invention, a secondary oxidation of the bump bonding portion can be prevented without using nitrogen gas and the like as in a conventional method, both the apparatus and the process can be greatly simplified, and a chip mounting having a high reliability in bonding and insulation properties can be carried out inexpensively.

THE BEST MODE FOR CARRYING OUT THE INVENTION

Hereinafter, desirable embodiments of the present invention will be explained referring to figures.

Figure 1:
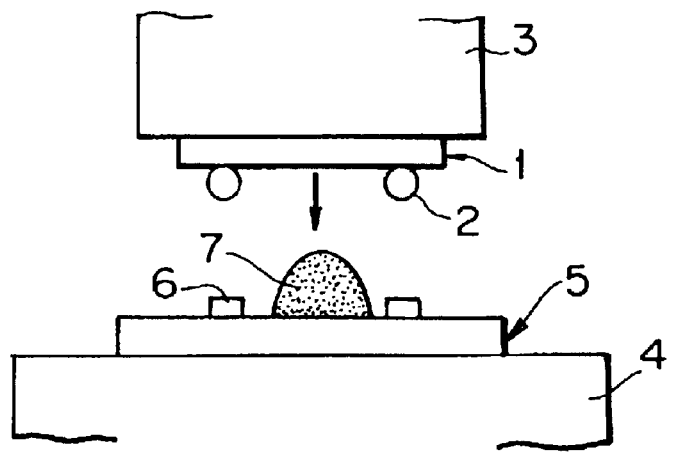
FIG. 1 is a schematic side view showing a state before chip mounting in a chip mounting method according to an embodiment of the present invention.

FIG. 1 shows a state immediately before chip mounting in a chip mounting method according to an embodiment of the present invention, and shows a case where bumps are formed on the chip side and electrodes are formed on the substrate side. In FIG. 1, numeral 1 shows a chip (for example, an IC chip), and at positions corresponding to the positions of electrodes (not shown) provided on the lower surface of the chip, bumps 2 (in this embodiment, solder bumps) are formed. Chip 1 is held by suction on the lower surface of a heat tool 3 of a chip bonding machine. In this embodiment, a primary oxidation preventing treatment such as the aforementioned treatment is performed to the surfaces of at least one of bumps 2 and electrodes of a substrate, and the solder bonding can be carried out without applying a flux.

As the primary oxidation preventing treatment for bumps 2 or the electrodes, the aforementioned treatments can be employed such as a treatment for cleaning by energy wave or energy particles, a chemical treatment for chemically bonding a substituent such as fluoro groups, and a treatment for plating gold onto the surface of the bump or the electrode.

Under chip 1, a substrate 5 (for example, a circuit board or a liquid crystal board) is held on and fixed to a stage for substrate 4 of the chip bonding machine. Electrodes 6 are formed on substrate 5 by, for example, gold plating. In this bonding machine, the position of substrate 5 held and fixed on the stage 4 is controlled relative to chip 1 held by suction on the lower surface of heat tool 3, and particularly, corresponding bumps 2 and electrodes 6 of substrate 5 are aligned to each other.

Before mounting chip 1 onto substrate 5, underfill agent 7 is applied to at least one of chip and substrate 5, in this embodiment, onto the upper surface of substrate 5. Although an underfill agent composed of a nonconductive adhesive is used as the underfill agent 7 in this embodiment, as the underfill agent in the present invention, a nonconductive paste, a nonconductive film, and an anisotropic conductive paste and film containing conductive particles such as gold plated plastic particles or solder particles are included. Although it is preferred that underfill agent 7 is applied after substrate 5 is held on stage 4 from the viewpoint of a desired accurate application in position, it is possible to apply it before being held. Further, in the state shown in FIG. 1, underfill agent 7 is applied on substrate 5 at a position between electrodes 6 so as not to cover each electrode 6 and so as to protrude in a form of a convex. Such a convex style application can be carried out by using a dispenser. Especially, in a case where chip 1 is further pushed after bumps 2 are heated and molten as described later, underfill agent 7 may be applied even on electrodes 6. As another method, it is possible to apply underfill agent 7 by screen printing, for example, in a plate-like form partially applied. However, in order to prevent voids from being involved more surely when underfill agent 7 is expanded as described later, it is preferred to apply the underfill agent 7 in a convex form as described above.

Figure 2:
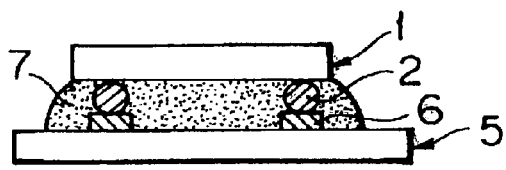
FIG. 2 is a schematic vertical sectional view showing a state where bumps of a chip and electrodes of a substrate are brought into contact with each other in the chip mounting method shown in FIG. 1.
Figure 3:
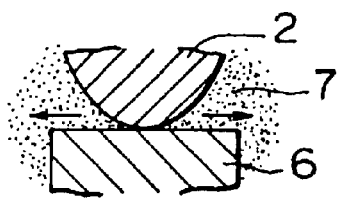
FIG. 3 is an enlarged sectional view of a bump-electrode portion at a time immediately before reaching the state shown in FIG. 2.

From the state shown in FIG. 1, chip 1 and substrate 5 are approached to each other. In this embodiment, heat tool 3 is moved downward, and bumps 2 of chip 1 are brought into contact with corresponding electrodes 6 of substrate 5. At that time, as shown in FIG. 2, underfill agent 7 having been applied on substrate 5 is pushed and expanded between chip 1 and substrate 5, and it fills a gap therebetween. Further, at that time, although the expanded underfill agent 7 is likely to be interposed between bumps 2 and electrodes 6, or, underfill agent 7 is likely to be present on electrodes 6 from the stage that the underfill agent 7 is applied prior to the mounting, the underfill agent 7 having been present between bumps 2 and electrodes 6 is pushed away toward around them in the process in which bumps 2 come into contact with electrodes 6, as shown in FIG. 3. Particularly, by moving down heat tool 3 at an appropriate pressing force and bringing bumps 2 into contact with electrodes 6 at an appropriate pressure, at least a part of the tip portion of each bump 2 can be brought into contact directly with each electrode 6 without interposing underfill agent 7. Further, because the tip portion (tip portion of the lower surface) of bump 2 is formed as a shape close to a spherical surface, underfill agent present around the tip portion is pushed away to around the bump 2 and the electrode 6 in contact with each other efficiently and smoothly.

As shown in FIG. 2, bumps 2 and electrodes 6 in contact with each other are in a condition where they are buried in expanded underfill agent 7, and they are substantially intercepted from the surrounding atmosphere completely. At that time, by pressing chip 1 at an adequate pushing force, or by controlling the position (height) of chip 1 adequately, and further, by controlling the temperature of underfill agent 7 adequately, a preferable pressing state between bumps 2 and electrodes 6 and a preferable expansion state of the underfill agent 7 can be both achieved. In this state, chip 1, ultimately, solder bumps 2, are heated at a predetermined temperature by heat tool 3, and the solder bumps 2 are molten and bonded to electrodes 6. Because bumps 2 are completely isolated from the surrounding atmosphere, a secondary oxidation does not occur on the bumps 2 being heated and molten. Therefore, purging of the atmosphere by nitrogen gas and the like for preventing the secondary oxidation as in a conventional method is unnecessary, thereby greatly simplifying both the apparatus and the process.

Further, in this embodiment, since a primary oxidation preventing treatment is carried out for bumps 2 in advance, application of flux such as in a conventional method is unnecessary, and cleaning of flux after heating and bonding, which is required in a case of flux application, is also unnecessary. Therefore, the process can be further simplified.

Furthermore, bumps 2 are heated at a predetermined temperature and molten in underfill agent 7, the bumps 2 can sufficiently wet-expand in a state prevented from secondary oxidation, and therefore, a high-reliability bonding between bumps 2 and electrodes 6 can be achieved. Because a desired bonding between bumps 2 and electrodes 6 can be achieved at a state prevented from secondary oxidation, it becomes possible to perform a main bonding at a time without separating the main bonding from a preliminary bonding, and the number of processes required by the time reaching the completion of the main bonding can be greatly decreased. From this point of view, both the apparatus and the process can be greatly simplified.

Figure 4:
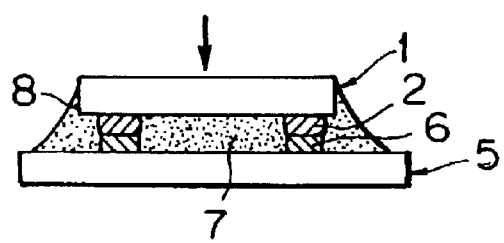
FIG. 4 is a schematic vertical sectional view showing a state where the chip is further pushed from the state shown in FIG. 2.

Although the apparatus and the process can be greatly simplified only by the above-described stages, further in this embodiment, a further pressing process of chip 1 is added as shown in FIG. 4. Although it is possible to omit this further pressing process of chip 1, addition of this process is preferable from the viewpoint of further increasing the bonding strength and the electrical insulation property.

As shown in FIG. 4, from the time when bumps 2 are heated and the bumps 2 are at least softened, or from the time when the bumps 2 are heated and molten, heat tool 3 is further moved down slightly, and chip 1 is further pressed toward substrate 5. By this action, underfill agent 7 having been expanded between chip 1 and substrate 5 is further pressed and expanded up to the side portion of chip 1. In this embodiment, particularly, the underfill agent 7 is pressed and expanded so as that a fillet 8 due to the underfill agent 7 is formed on the side portion of chip 1. Therefore, the above-described additional pushing amount may be an amount corresponding to that capable of forming fillet 8. By such a further pressed and expanded underfill agent 7, the bonding strength between chip 1 and substrate 5 can be increased. Especially, by forming fillet 8, as compared with a case of no fillet, chip 1 is bonded to and held by substrate 5 more strongly. Further, because the bonding portions of bumps 2 and electrodes 6 are sealed from the surrounding environment more completely, the reliability in electrical insulation can be further increased. Furthermore, because the bonding area of bumps 2 is increased by the further pressing, the reliability in electrical insulation and the bonding strength can be further increased. Where, since there may be a case where bumps 2 are broken by the pressing if only a simple pressure control is carried out, it is preferred to control the pressing height, for example, by detecting the further pressing amount from the condition, where bumps 2 and electrodes 6 come into contact with each other, by a sensor. Further, it is possible to correct the shapes of bumps 2 by slightly lifting chip 1 after the pressing.

In this state, underfill agent 7 is cured. Then, cooling is carried out, and the bonding portions of bumps 2 and electrodes 6 are solidified. Complete cure of underfill agent 7 may be late in time as compared with the solidification of the bonding portions.

Although bumps 2 of the side of chip 1 are formed as solder bumps in the above-described embodiment, it is possible to form electrodes 6 of the side of substrate 5 as a solder constitution, and it is also possible to form both of them as a solder constitution. Further, in the present invention, the formation of chip 1 is not particularly limited, and as long as having a bump to be metal bonded in which a secondary oxidation due to heating becomes a problem, the present invention can be effectively applied to any type of chip. Further, the formation of substrate also is not particularly limited, and the present invention can be applied to any type of substrate to which a chip having a bump is mounted. Furthermore, although an aspect forming bumps 2 on the side of chip 1 and forming electrodes 6 on the side of substrate 5 is explained in the above-described embodiment, in the present invention, the bump is not limited to the chip side, and the bump may be formed on the substrate side or on both the chip side and the substrate side. In a case where bumps are formed on both sides, as aforementioned, an "electrode" in the present invention means a technical concept including a bump.

In particular, the present invention is suitable for bonding of objects having many bumps or for bonding of objects formed with bumps at a fine pitch. Particularly, in a case of many bumps, the present invention can be easily carried out by setting a pressure per one bump adequately. Further, even in a case of an object having bumps at a fine pitch, it is not necessary to inject an underfill agent into a gap between a chip and a substrate approached to each other, and the present invention can be easily carried out because the underfill agent may be applied initially.

Further, as the primary oxidation preventing treatment for a bump or an electrode, as aforementioned, treatments can be employed such as a treatment for cleaning by energy wave or energy particles, a chemical treatment for chemically bonding a substituent such as fluoro groups, and a treatment for plating gold onto the surface of the bump. Furthermore, a method for cleaning by using energy wave or energy particles or by using a solution, and thereafter, mounting the cleaned object under a condition controlling a time (in a predetermined time) before the object is oxidized again, or a method for mounting the object in an Ar or $N_2$ atmosphere after the above-described cleaning, can also be employed.

INDUSTRIAL APPLICATIONS OF THE INVENTION

In the chip mounting method according to the present invention, because the apparatus and the process can be both greatly simplified, and the secondary oxidation of bumps can be prevented and the mounting can be carried out with a high reliability in insulation property, the present invention can be applied to any field requiring the mounting of a chip to a substrate. Particularly, the present invention is suitable to a process for mounting many chips in a short period of time, and can contribute to a great simplification of the process, a great reduction of the cost of the apparatus, a great shortening of the tact time, and a great increase in quality.

What is claimed is:

1. A method for mounting a chip by bonding a bump formed on at least one of the chip and a substrate to an electrode formed on the other and providing an underfill agent between the chip and the substrate, comprising the steps of:

applying the underfill agent onto at least one of the substrate and the chip spaced apart from the bump or the electrode so as to allow the electrode to remain uncovered and so as to protrude in a form of a convex surface;

moving the chip to the substrate to bring the bump into contact with the electrode and to distribute the underfill agent, in a space between the chip and the substrate, to around the bump and the electrode in contact with each other;

after completing the distribution of the underfill agent, heating the bump or the electrode in a state that the bump or the electrode is completely buried in the underfill agent to melt at least one of the bump and the electrode so as to weld the bump to the electrode; and further pressing the chip toward the substrate during or after said step of heating the bump or the electrode so that the underfill agent is distributed beyond a side portion of the chip so as to form a fillet which covers a portion of a side surface of the chip.

2. The chip mounting method according to claim 1, wherein, before the chip is mounted to the substrate, said method further comprising the step of treating at least one of the bump and the electrode for preventing a primary oxidation thereof that may be generated by the time of the mounting.

3. The chip mounting method according to claim 2, wherein said step of treating includes cleaning at least one of the bump and the electrode by an energy wave or energy particles for preventing the primary oxidation.

4. The chip mounting method according to claim 3, wherein said step of cleaning includes using a plasma, ion beam, atomic beam, radical beam or laser as the energy wave or energy particles.

5. The chip mounting method according to claim 2, wherein said step of treating includes chemically bonding a substituent for removing oxygen to a surface of at least one of the bump and the electrode, or, using a reducing operation including hydrogen to remove an oxide from the surface for preventing the primary oxidation.

6. The chip mounting method according to claim 2, wherein said step of treating includes gold plating at least one of the bump and the electrode for preventing the primary oxidation.

7. The chip mounting method according to claim 1, wherein said step of further pressing the chip includes forming a fillet which covers an entire side surface of the chip.

8. A method for mounting a chip by bonding a bump formed on a chip to an electrode formed on the substrate, comprising the steps of:

applying the underfill agent onto the substrate spaced apart from the electrode so as to allow the electrode to remain uncovered and so as to protrude in a form of a convex surface;

moving the chip to the substrate to bring the bump into contact with the electrode and to distribute the underfill agent, in a space between the chip and the substrate to bury the bump and the electrode in the underfill agent;

heating the bump or the electrode to melt at least one of the bump and electrode so as to weld the bump to the electrode; and further pressing the chip during or after heating the bump or the electrode so that the underfill agent is distributed beyond a side of the chip so as to form a fillet that covers a portion of a side surface of the chip.

9. The chip mounting method according to claim 8, wherein said step of further pressing the chip includes forming a fillet which covers an entire side surface of the chip.

10. A method for mounting a chip by bonding a bump formed on at least one of the chip and a substrate to an electrode formed on the other and providing an underfill agent between the chip and the substrate, comprising the steps of:

applying the underfill agent onto at least one of the substrate and the chip spaced apart from the bump or the electrode so as to allow the electrode to remain uncovered and so as to protrude in a form of a convex surface;

moving the chip to the substrate to bring the bump into contact with the electrode and to distribute the underfill agent, in a space between the chip and the substrate, to around the bump and the electrode in contact with each other;

after completing the distribution of the underfill agent, heating the bump or the electrode in a state that the bump or the electrode is completely buried in the underfill agent to melt at least one of the bump and the electrode so as to weld the bump to the electrode; and further pressing the chip toward the substrate during or after said step of heating the bump or the electrode so that the underfill agent is distributed beyond a side portion of the chip so as to form a fillet which completely covers a side surface of the chip.

* * * * *